(12) United States Patent
Liang et al.

(10) Patent No.: US 9,999,110 B2
(45) Date of Patent: Jun. 12, 2018

(54) LED DRIVER WITH COMPREHENSIVE FAULT PROTECTIONS

(71) Applicant: DIALOG SEMICONDUCTOR INC., Campbell, CA (US)

(72) Inventors: Enzhu Liang, Pacifica, CA (US); Yuwen Wang, Hayward, CA (US); Ming Gu, San Jose, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 325 days.

(21) Appl. No.: 14/787,270

(22) PCT Filed: Jun. 16, 2014

(86) PCT No.: PCT/US2014/042591
§ 371 (c)(1),
(2) Date: Oct. 27, 2015

(87) PCT Pub. No.: WO2014/204871
PCT Pub. Date: Dec. 24, 2014

(65) Prior Publication Data
US 2016/0081148 A1 Mar. 17, 2016

Related U.S. Application Data

(60) Provisional application No. 61/837,036, filed on Jun. 19, 2013.

(51) Int. Cl.
*H05B 37/00* (2006.01)
*H05B 33/08* (2006.01)
*G01R 31/44* (2006.01)

(52) U.S. Cl.
CPC .......... *H05B 33/089* (2013.01); *G01R 31/44* (2013.01); *Y02B 20/341* (2013.01)

(58) Field of Classification Search
CPC ...... H05B 33/0884; G09G 3/14; G01R 31/02; G01R 31/025; G01R 31/041; G01R 31/44
(Continued)

(56) References Cited

U.S. PATENT DOCUMENTS

| 5,352,937 | A | 10/1994 | Dingwall |
| 7,550,934 | B1 * | 6/2009 | Deng ................. H05B 33/0887 315/209 R |

(Continued)

FOREIGN PATENT DOCUMENTS

| CN | 101686591 A | 3/2010 |
| WO | WO 98/55880 A1 | 12/1998 |
| WO | WO 2011/040512 A1 | 4/2011 |

OTHER PUBLICATIONS

Chinese First Office Action, Chinese Application No. 201480035200.9, dated Sep. 27, 2016, 20 pages.
(Continued)

*Primary Examiner* — Alesa Allgood
(74) *Attorney, Agent, or Firm* — Fenwick & West LLP

(57) ABSTRACT

The embodiments disclosed herein describe a set of fault detection circuits for LED circuits in an LED channel. A first fault detection circuit is configured to detect a short fault across one or more LEDs. A second fault detection circuit is configured to detect an open fault across an LED. A third fault detection circuit is configured to detect a short across an LED channel transistor. A fourth fault detection circuit is configured to detect an LED channel sense resistor open fault. A fifth fault detection circuit is configured to detect if the LED channel is being intentionally unused. These fault detect circuits can be implemented in a fault detection integrated circuit coupled to the LED channel.

16 Claims, 4 Drawing Sheets

(58) Field of Classification Search
USPC ....... 315/122, 291, 185 R, 186, 294; 361/42, 361/93.1; 324/414, 556, 500
See application file for complete search history.

(56) References Cited

U.S. PATENT DOCUMENTS

| | | |
|---|---|---|
| 2005/0057179 A1 | 3/2005 | Madhani et al. |
| 2005/0212459 A1 | 9/2005 | Patel et al. |
| 2006/0170287 A1 | 8/2006 | Ito et al. |
| 2007/0013322 A1 | 1/2007 | Tripathi et al. |
| 2007/0257725 A1* | 11/2007 | De .................. H03K 17/08128 327/379 |
| 2009/0322234 A1 | 12/2009 | Chen et al. |
| 2011/0068700 A1 | 3/2011 | Fan |
| 2011/0169424 A1 | 7/2011 | Aboulnaga |
| 2011/0254530 A1 | 10/2011 | Hulett |
| 2012/0068614 A1 | 3/2012 | Ng et al. |
| 2012/0176039 A1 | 7/2012 | Sato et al. |
| 2012/0206146 A1 | 8/2012 | Avenel |
| 2012/0223648 A1 | 9/2012 | Jin et al. |
| 2012/0235574 A1 | 9/2012 | Sumi et al. |
| 2012/0299483 A1 | 11/2012 | Lethellier |
| 2013/0016310 A1 | 1/2013 | Kanemitsu et al. |
| 2013/0049599 A1 | 2/2013 | Logiudice |
| 2013/0082615 A1 | 4/2013 | Williams et al. |
| 2013/0093339 A1 | 4/2013 | Chen et al. |
| 2013/0099681 A1 | 4/2013 | Williams et al. |
| 2013/0147375 A1 | 6/2013 | Williams et al. |

OTHER PUBLICATIONS

Chinese Second Office Action, Chinese Application No. 201480035200.9, dated Mar. 17, 2017, 8 pages.
PCT International Search Report, PCT/US2014/042591, dated Oct. 28, 2014, 18 Pages.

* cited by examiner

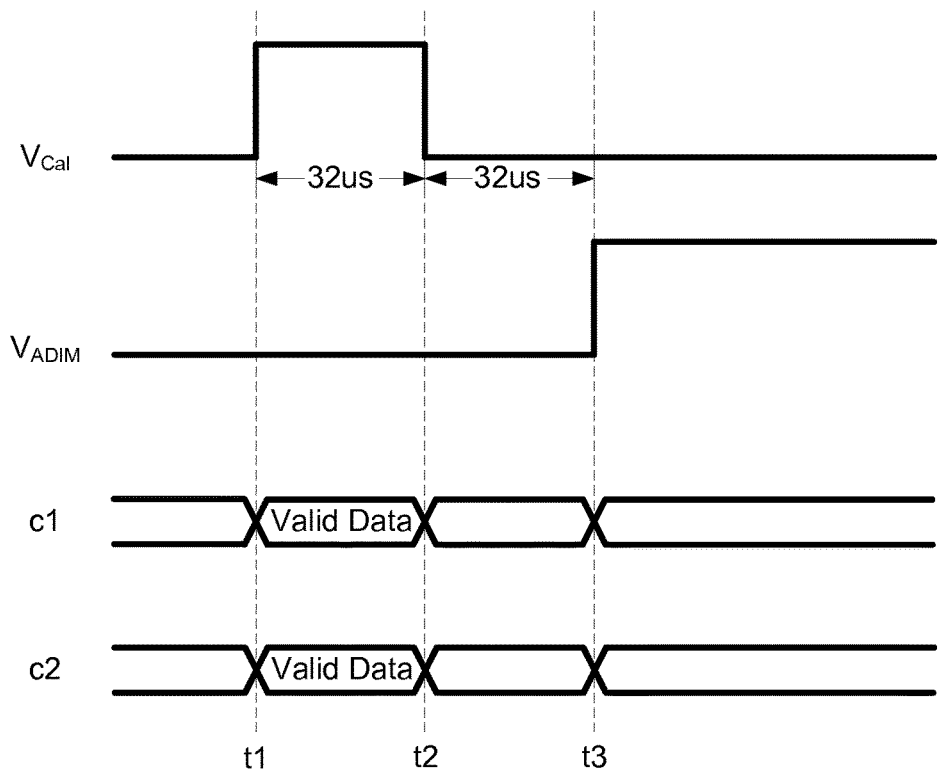

LED DRIVER WITH COMPREHENSIVE FAULT PROTECTIONS

RELATED APPLICATIONS

This application is the National Stage of International Application No. PCT/US2014/042591, filed Jun. 16, 2014, published in English under PCT Article 21(2), which claims priority to U.S. Provisional Application No. 61/837,036, filed Jun. 19, 2013, the contents of which are incorporated herein by reference in their entirety.

FIELD OF THE INVENTION

This invention pertains generally to the field of LED circuits and, more particularly, to LED circuit fault detection.

BACKGROUND

Three-dimensional televisions and other displays often require increasingly higher current and higher density LED arrays. In some instances, electrical current flowing through each string of LEDS in an LED array for display backlighting ranges from around 100 mA to 1 A or greater. In order to address the heat produced by such currents and to lower IC cost, display manufacturers can move heat-producing components, such as power MOSFETs and LED current sensing resistors, off chip.

SUMMARY OF THE INVENTION

The present disclosure describes a set of fault detection circuits for LED circuits. These fault detection circuits can be implemented within a fault detection IC. Two such fault detection circuits are an LED short fault detection circuit and an LED open fault detection circuit. In addition, the fault detection IC can include a MOSFET drain-to-source short fault detection circuit, a sense resistor open fault detection circuit, a sense resistor short fault detection circuit, and an LED channel short detection circuit. The fault detection IC can further include circuitry configured to determine if a particular LED channel is unused. The fault detection IC can include circuits configured to act as a first type of fault detection circuit in a calibration mode, and as a second type of fault detection circuit in an operation mode.

BRIEF DESCRIPTION OF THE DRAWINGS

FIG. 4 illustrates a timing diagram for fault detection circuits during a calibration mode, according to one embodiment.

FIG. 5 illustrates a logic table for use in detecting faults in a calibration mode, according to one embodiment.

DETAILED DESCRIPTION

The Figures (Figs.) and the following description relate to various embodiments by way of illustration only. Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

Figure 1:
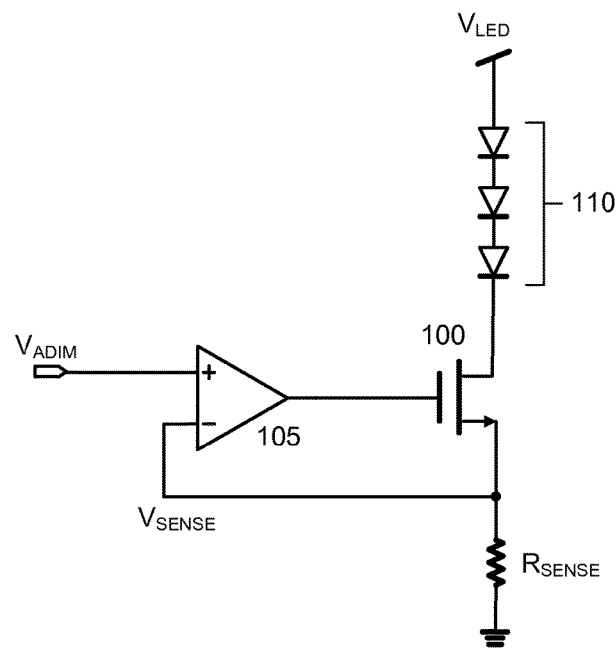
FIG. 1 shows an LED driver circuit, according to one embodiment.

FIG. 1 shows an LED driver circuit, according to one embodiment. The driver circuit of FIG. 1 includes MOSFET 100, amplifier 105, and sense resistor $R_{SENSE}$. The positive input terminal of the amplifier 105 is coupled to an input $V_{ADIM}$, and the negative input terminal of the amplifier is coupled to the source node of the MOSFET 100. An LED string 110 is coupled between the voltage source $V_{LED}$ and the drain node of the MOSFET 100.

The output of the amplifier 105 is coupled to the gate node of the MOSFET 100. The amplifier 105 outputs a signal based on the difference between signals received at the positive and negative input terminals of the amplifier. In one embodiment, the amplifier 105 is a high gain amplifier. The input $V_{ADIM}$ controls the switching of the gate node of the MOSFET 100.

When the output of the amplifier 105 is high, the MOSFET 100 acts as a closed switch. In such a configuration, current flows from the voltage source $V_{LED}$, through the LED string 110 (causing the LEDs to emit light), through the drain node of the MOSFET 100 to the source node of the MOSFET, and through the resistor $R_{SENSE}$. When the output of the amplifier 105 is low, the MOSFET 100 acts as an open switch, preventing current from flowing from the voltage source $V_{LED}$ through the MOSFET (and thus preventing the LEDs from emitting light).

In the embodiment of FIG. 1, the resistor $R_{SENSE}$ is generally a low-resistance resistor. For example, the resistance of $R_{SENSE}$ may be equal to or less than 2Ω. The voltage across $R_{SENSE}$ ($V_{SENSE}$) is used as a feedback signal to control the output of the amplifier 105, which in turn controls the switching of the MOSFET 100 and the current through the LED string 110.

In one example embodiment, $V_{LED}$ is 70V and the LED string 110 includes 20 LEDs. In this embodiment, when current is flowing through the MOSFET 100, the voltage drop across each LED is approximately 3.3V. As a result, the voltage at the drain node of the MOSFET 100 is approximately 4V.

Manufacturing defects and gradual degradation over time can occur within off-chip MOSFETs, LED current sensing resistors, and other off-chip components. One or more LEDs in the LED string 110 can be shorted or opened. Shorted LEDs can be particularly problematic, as they can cause additional LEDs to become shorted, and can cause overheating on an external MOSFET 100. In addition, the source and drain nodes of the MOSFET 100 can be shorted. Further, the nodes of the sensing resistor $R_{SENSE}$ can shorted or opened. Traditional on-chip LED short and open circuit protections generally fall short of addressing such defects for off-chip components.

Figure 2:
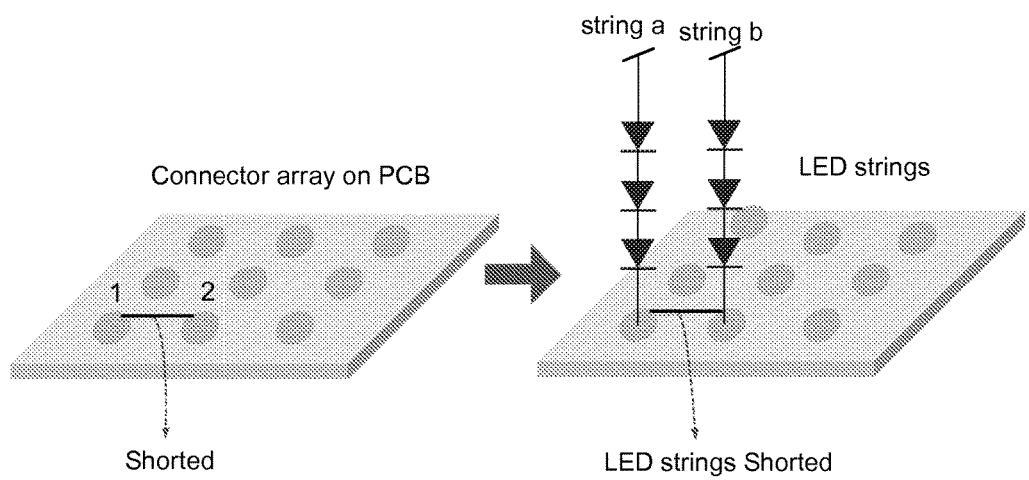
FIG. 2 illustrates a connector array on a PCB with a short between adjacent connector nodes, according to one embodiment.

In addition, individual LED channels can be shorted. FIG. 2 illustrates a connector array on a PCB with a short between adjacent connector nodes 1 and 2. If an LED string A is coupled to node 1, and an LED string B is coupled to node 2, the power circuit used to control current flow through LED string A can additionally cause current to flow through LED string B. Thus, fault detection and prevention is necessary for LED channel shorts as well.

As noted above, the present disclosure describes fault detection circuits for use with LED circuits and LED power circuits. It should be noted that in other embodiments, the described circuits can be used in conjunction with other circuits, systems, and devices. The fault detection circuits can detect the presence of one or more types of circuit faults either before circuit operation (for instance, during a calibration mode) or in real-time during circuit operation. Such flexibility can optimize the likelihood that a fatal circuit fault is detected, and can help reduce the likelihood of damaging the circuit or a related circuit or system.

Figure 3:
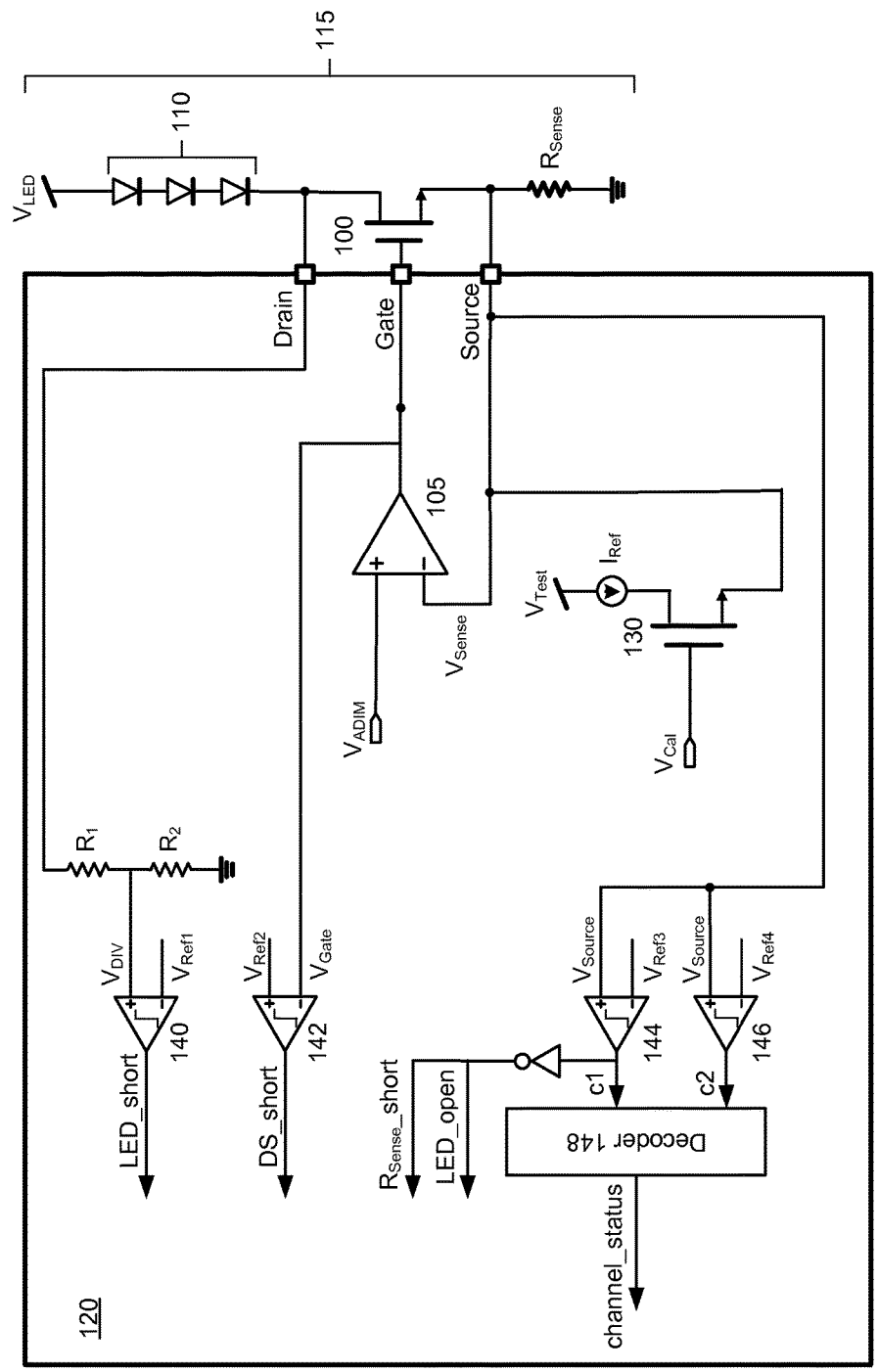
FIG. 3 illustrates a set of fault detection circuits for use in LED circuits, LED driver circuits, and LED channels, according to one embodiment.

FIG. 3 illustrates a set of fault detection circuits for use in LED circuits, LED driver circuits, LED channels, and any other suitable LED circuit, according to one embodiment. In the embodiment of FIG. 3, the fault detection circuits are included on a single IC 120, though it should be noted that in other embodiments, the fault detection circuits can be included on separate ICs, or can be implemented in other contexts. Further, it should be noted that in other embodiments, the fault detection IC 120 only includes a subset of the fault detection circuits described herein. In the embodiment of FIG. 3, the fault detection IC 120 is coupled to an LED channel 115 made up of the LED string 110, the MOSFET 100, and the sense resistor $R_{Sense}$. It should be noted that although the term "fault detection IC" is used, it should be noted that the fault detection functionality described herein can be incorporated into other circuits, such as LED driver circuits, or can be implemented in standalone circuits.

The fault detection IC 120 can include an LED short detection circuit configured to detect LED short circuit faults. The LED short detection circuit includes a voltage divider, made up of $R_1$ and $R_2$, and a comparator 140. The LED short detection circuit detects shorts across one or more LEDs in the LED string 120. The voltage divider is coupled to the drain node of the MOSFET 100. As noted above, the voltage at the drain node of the MOSFET 100 is equal to the difference between the source voltage $V_{LED}$ and the cumulative voltage drops over the LEDs in the LED string 110.

The comparator 140 receives the voltage divider voltage $V_{DIV}$ and a reference voltage $V_{Ref1}$, compares the two voltages, and outputs an error signal LED_short based on the comparison. The values of the resistors $R_1$ and $R_2$ can be selected to reduce the voltage at the drain node of the MOSFET 100 by a pre-determined percentage. The reference voltage $V_{Ref1}$ can be selected to satisfy the following two conditions:

1. $V_{Ref1} < V_{DIV}$ if one or more LEDs in the LED string 110 is shorted, and
2. $V_{Ref1} > V_{DIV}$ if no LEDs in the LED string 110 are shorted For example, if one or more LEDs in the LED string 110 are shorted, the voltage drop across the LED string will decrease, resulting in a greater voltage at the drain node of the MOSFET 100 than if no LEDs were shorted. The comparator 140 detects such a higher voltage by comparing the voltage $V_{DIV}$, which is based on the drain voltage of the MOSFET 100, to reference voltage $V_{Ref1}$, and outputs an error signal LED_short if $V_{DIV} > V_{Ref1}$. It should be noted that the LED short detection circuit can beneficially detect LED short circuit faults during real-time operation of the LED string 110 and MOSFET 100.

The fault detection IC 120 can include an LED open detection circuit configured to detect LED open circuit faults. The LED open detection circuit includes a comparator 144. The comparator 144 receives the voltage at the source node of the MOSFET 100 and a reference voltage $V_{Ref3}$, compares the two voltages, and outputs an error signal LED_open based on the comparison. In the event of an LED open circuit fault condition, no current flows through LED channel 115 (from the source voltage $V_{LED}$ through the MOSFET 100 and the sense resistor $R_{sense}$). When current is not flowing through the sense resistor $R_{sense}$, there is no voltage drop across $R_{sense}$, and the voltage at the source node of the MOSFET 100 is zero.

The reference voltage $V_{Ref3}$ can be selected to satisfy the following two conditions:

1. $V_{Ref3} > 0$, and
2. $V_{Ref3} < V_{Source}$ during normal operation of LED string 110 (no open circuit fault)

The comparator 144 is configured to output the error signal LED_open when the voltage $V_{Source}$ is less than the reference voltage $V_{Ref3}$. For example, if current is flowing from the source voltage $V_{LED}$ through the LED string 110 and the MOSFET 100, the voltage $V_{Source}$ is equal to the product of the current and the resistance of $R_{sense}$. If the current flowing through the MOSFET 100 is 1 A and the resistance of $R_{sense}$ is 2Ω, then $V_{Source}$ is 2V. If $V_{Ref3}$ is selected to be 1V, then the comparator 144 will output the error signal LED_open when no current is flowing through the MOSFET 100 (since $V_{Source}$ will be 0V, less than the 1V reference voltage), and will not output the error signal when the 1 A current is flowing through the MOSFET (since $V_{Source}$ will be 2V, greater than the 1V reference voltage). It should be noted that the LED open detection circuit can beneficially detect LED open circuit faults during real-time operation of the LED string 110 and the MOSFET 100.

The fault detection IC 120 can include a MOSFET short detection circuit configured to detect a short circuit fault between the source and drain nodes of the MOSFET 100. The MOSFET short detection circuit includes the comparator 142. If the drain and source nodes of the MOSFET 100 are shorted, current continuously flows from the source voltage $V_{LED}$ and through the LED string 110 and resistor $R_{sense}$. In such instances, the voltage $V_{Sense}$ stays higher than $V_{ADIM}$, and the high-gain amplifier 105 outputs the voltage $V_{Gate}$, which reflects the continuously high voltage $V_{Sense}$. Accordingly, $V_{Gate}$ tends towards 0V, lower than the voltage $V_{Gate}$ required to cause the MOSFET 100 to act as an open circuit in normal operation.

The comparator 142 receives the voltage $V_{Gate}$ and the reference voltage $V_{Ref2}$, compares the two voltages, and outputs an error signal DS_short based on the comparison. The reference voltage $V_{Ref2}$ can be selected to satisfy the following two conditions:

1. $V_{Ref2} > V_{Gate}$ when $V_{Sense}$ stays high (as a result of a short circuit fault between the drain and source nodes of MOSFET 100), and
2. $V_{Ref2} < V_{Gate}$ during normal operation of MOSFET 100 (the voltage required to configure the MOSFET to act as an open switch)

The comparator 142 is configured to output the error signal DS_short when the voltage $V_{Ref2}$ is greater than the voltage $V_{Gate}$. It should be noted that the MOSFET short detection circuit can beneficially detect short circuit faults between the drain node and the source node of the MOSFET 100 during real-time operation of the MOSFET 100.

The fault detection IC 120 can include a sense resistor short detection circuit configured to detect a short circuit fault across $R_{Sense}$. The sense resistor short detection circuit includes a comparator, and in one embodiment, includes the comparator 144. When a short circuit fault exists across $R_{Sense}$, the voltage drop across $R_{Sense}$ is 0V. This is a similar result to an LED open circuit fault—both result in a 0V potential across $R_{Sense}$. Accordingly, the same comparator can be used to detect both faults. $V_{Ref3}$ can be selected to satisfy the same two conditions discussed above, and the comparator 144 can output the error signal $R_{Sense\_}$short in response to a determination that $V_{Source}<V_{Ref3}$. It should be noted that in other embodiments, the sense resistor short detection circuit and the LED open circuit detector can each include a separate comparator. Further, the sense resistor short detection circuit can beneficially detect sense resistor short circuit faults during the real-time operation of the MOSFET 100.

The fault detection IC 120 can include a sense resistor open detection circuit configured to detect an open circuit fault across $R_{Sense}$. When $R_{Sense}$ includes an open circuit fault, current cannot flow through the LED channel 115. The fault detection IC 120 can also include an unused LED channel detection circuit configured to detect if the LED channel 115 is unused. If an LED channel is to be unused, the sense resistor $R_{Sense}$ (generally ~2Ω or less) can be replaced with a much larger resistor, for example 100 kΩ or more. Both unused channels and sense resistor open circuit faults prevent enough current from flowing through the LEDs in the LED channel 120 to cause the LEDS to emit light.

In one embodiment, the sense resistor open detection circuit and the unused LED channel detection circuit are implemented by the same circuit. In addition, in some embodiments, the sense resistor open detection circuit and the unused LED channel detection circuit detect open circuit faults and unused LED channels, respectively, before real-time operation of the LED channel 115, for instance in a calibration mode. In such embodiments, such as the embodiment of FIG. 3, the sensor resistor open detection circuit and the unused LED channel detection circuit can also be implemented in the same circuit as the LED open detection circuit described above. It should be noted that in other embodiments, the sense resistor open detection circuit, the unused LED channel detection circuit, and the LED open detection circuit can be implemented in separate circuits.

The sense resistor open detection circuit and the unused LED channel detection circuit include the comparator 144, the comparator 146, the MOSFET 130, the current source $I_{Ref}$, the input $V_{Cal}$, and the decoder 148. The comparator 144 receives the voltage at the source node of the MOSFET 100, $V_{Source}$, compares it to the reference voltage $V_{Ref3}$, and outputs a signal c1 based on the comparison. Since the detection of sense resistor open circuit faults and unused LED channels occurs in a calibration mode (or any other mode prior to real-time operation of the LED channel 115), the value of $V_{Ref3}$ used by the comparator 144 can be different than the value of $V_{Ref3}$ used when detecting LED open circuit faults. The comparator 146 receives the voltage $V_{Source}$, compares it to the reference voltage $V_{Ref4}$, and outputs a signal c2 based on the comparison.

During the calibration mode, the input $V_{Cal}$ goes high, configuring the MOSFET 130 to act as a closed switch, causing the current $I_{Ref}$ to flow through the MOSFET 130. In embodiments where $R_{Sense}$ includes an open circuit fault, the voltage $V_{Source}$ becomes equal to $V_{Test}$. For example, $V_{Test}$ can be 5V. In embodiments wherein the LED channel 115 is unused, the voltage $V_{Source}$ is equal to $I_{Ref}*R_{sense}$. For example, if $I_{Ref}=10$ μA and $R_{sense}=100$ kΩ, then $V_{Source}=1V$.

FIG. 4 illustrates a timing diagram for the fault detection circuits of the fault detection IC 120 during a calibration mode, according to one embodiment. Calibration mode begins at time t1. At t1, $V_{Cal}$ goes high for a period of 32 μs. During this time interval, $V_{ADIM}$ stays low, preventing operation of the LED channel 115. When $V_{Cal}$ is high, the comparators 144 and 146 produce signals c1 and c2, respectively, and the decoder 148 produces a channel status signal based on c1 and c2. At time t2, $V_{Cal}$ goes low, marking the end of calibration mode. After a period of 32 μs, at time t3, $V_{ADIM}$ goes high, and the LED channel 115 operates in a normal mode. It should be noted that the periods of time selected herein for calibration mode are merely exemplary, and can be different in other embodiments.

In one embodiment, the reference voltage $V_{Ref3}$ can be selected to satisfy the following two conditions:
1. $V_{Ref3}<I_{Ref}*R_{sense}$ when $R_{Sense}>1$ kΩ, and
2. $V_{Ref3}>I_{Ref}*R_{sense}$ when $R_{Sense}<1$ kΩ

The comparator 144 is configured to output the signal c1 as high when $V_{Source}>V_{Ref3}$, and to output the signal c1 as low when $V_{Source}<V_{Ref3}$. Continuing with the previous example, if $I_{Ref}*R_{sense}=1V$ when $R_{sense}=100$ kΩ and if $I_{Ref}*R_{sense}=20$ μV when $R_{sense}=2Ω$, then selecting $V_{Ref3}=0.5V$ will result in the comparator 144 outputting c1 as high when the LED channel is unused, and outputting c1 as low when the LED channel is used. It should be noted that $V_{Ref3}$, as well as any of the reference voltages described herein, can be selected according to other criteria than those described herein.

In one embodiment, the reference voltage $V_{Ref4}$ can be selected to satisfy the following two conditions:
1. $V_{Ref4}<V_{Test}$, and
2. $V_{Ref4}>I_{Ref}*R_{sense}$ when $R_{Sense}\geq 100$ kΩ

The comparator 146 is configured to output the signal c2 as high when $V_{Source}>V_{Ref4}$, and to output the signal c2 as low when $V_{Source}<V_{Ref4}$. Continuing with the previous example, if $V_{Test}=5$ v, $V_{Ref4}=4.5V$, and $R_{Sense}$ is open, then $V_{Source}=V_{Test}$, and the comparator will determine that $V_{Source}>V_{Ref4}$, outputting c2 as high. Likewise, if $R_{Sense}<100$ kΩ, then the comparator will determine that $V_{Source}<V_{Ref4}$, outputting c2 as low.

The decoder 148 is configured to receive the signal c1 and c2, and is configured to output the signal channel_status in response to the values of c1 and c2. FIG. 5 illustrates a logic table for use by the decoder 148 in detecting faults in a calibration mode, according to one embodiment. When c1 and c2 are low, the output signal channel_status indicates that no fault is detected, and that the LED channel 115 is in use (for example, $R_{Sense}\leq 2Ω$). When c1 is high and c2 is low, the output signal indicates that the LED channel 115 is not intentionally in use (for example, $R_{Sense}>100$ kΩ). When c1 is low and c2 are high, the output signal indicates that a fault is detected, and that $R_{Sense}$ includes an open circuit. In other embodiments, the comparators 144 and 146 can output c1 and c2, respectively, according to different criteria than those described herein, and the decoder 148 can output different channel_status signals in response to different criteria or different inputs than those described herein.

Figure 6:
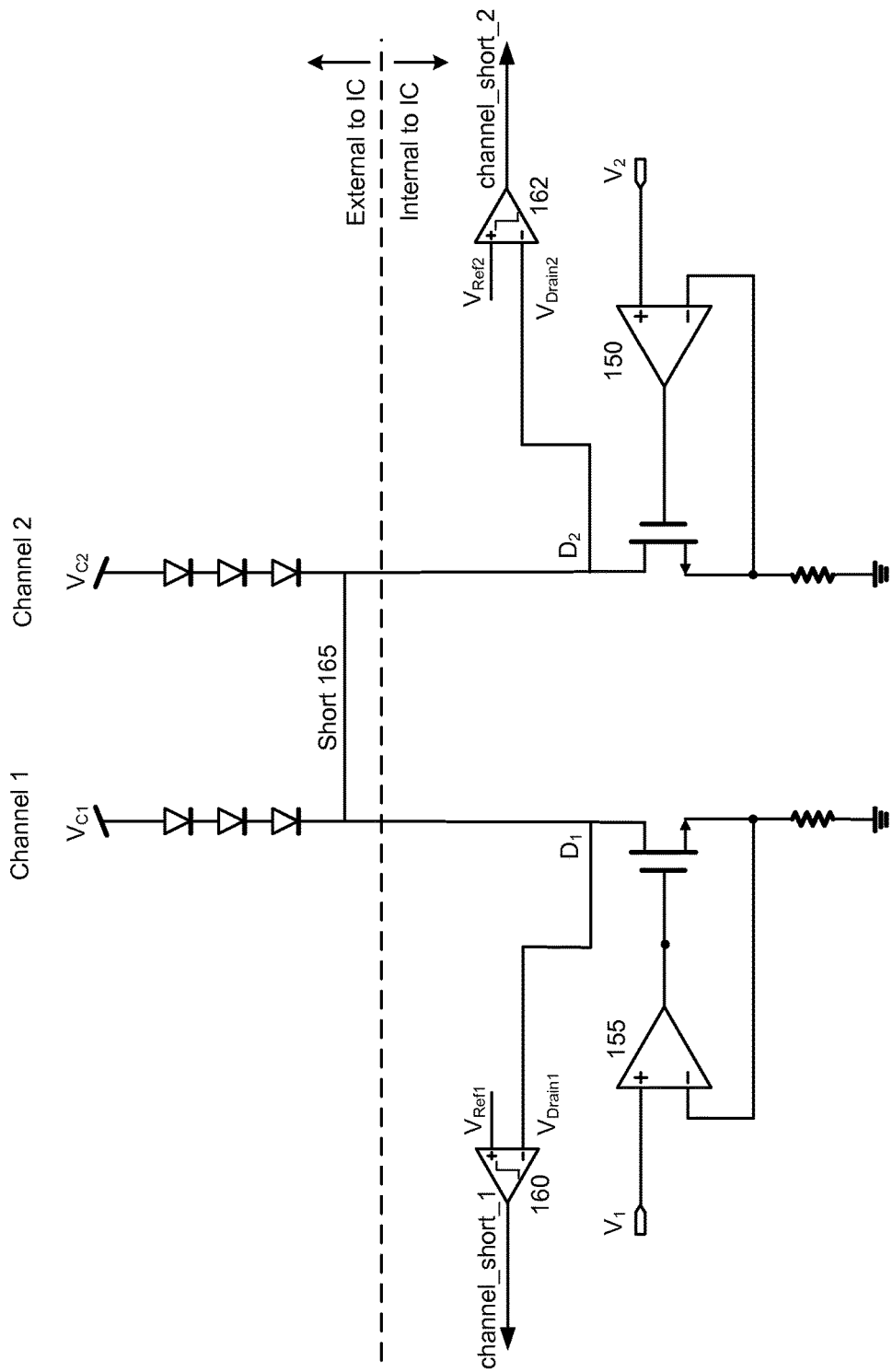
FIG. 6 illustrates an LED channel short circuit fault detection circuit, according to one embodiment.

The fault detection IC 120 can include an LED channel short detection circuit configured to detect short circuit faults between LED channels, for instance at the PCB level. FIG. 6 illustrates an LED channel short circuit fault detection circuit, according to one embodiment. The embodiment of FIG. 6 includes two LED channels, channel 1 and channel 2. Each LED channel includes a string of LEDs, a MOSFET, and a sense resistor. The gate of the MOSFET of channel 1 is coupled to the amplifier 155, which receives input signal $V_1$. The gate of the MOSFET of channel 2 is coupled to the amplifier 150, which receives input signal $V_2$.

The LED channel short detection circuit of FIG. 6 includes the comparator 160, which is configured to receive the gate voltage of the MOSFET of channel 1 ($V_{Drain1}$), and the reference voltage $V_{Ref1}$. The comparator 160 is further configured to compare $V_{Drain1}$ and $V_{Ref1}$, and to output the signal channel_short_1 in response to the comparison. Similarly, the LED channel short detection circuit of FIG. 6 includes the comparator 162, which is configured to receive the gate voltage of the MOSFET of channel 2 ($V_{Drain2}$), and the reference voltage $V_{Ref2}$. The comparator 162 is further configured to compare $V_{Drain2}$ and $V_{Ref2}$, and to output the signal channel_short_2 in response to the comparison. It should be noted that in some embodiments the reference voltages $V_{Ref1}$ and $V_{Ref2}$ are the same voltage. In addition, in some embodiments, the signals channel_short_1 and channel_short_2 are the same signal (as a short between channel 1 and channel 2 is detectable by either comparator 160 or 162).

In the embodiment of FIG. 6, channel 1 and channel 2 include a short circuit fault 165, which couples the drain node of the MOSFET of channel 1 ($D_1$) to the drain node of the MOSFET of channel 2 ($D_2$). The short circuit fault 165 in the embodiment of FIG. 6 is shown external to the fault detection IC (for instance, at the PCB level), but it should be noted that in some embodiments, short circuit faults between LED channels can be internal to the fault detection IC. The short 165 causes the voltage on the drain nodes of the MOSFETs to be the same. In embodiments without the short 165, for example, when $V_2$ is high and $V_1$ is low, the MOSFET of channel 2 is configured to act as a closed switch and the MOSFET of channel 1 is configured to act as an open switch. Accordingly, current is configured to flow through channel 2, but not channel 1. In such circumstances, the voltage at the drain of the MOSFET of channel 1 is equivalent to the LED supply voltage $V_{C1}$, since no current is flowing through channel 1. In embodiments with the short 165, current can flow through the LED string of channel 1, through the short 165, and through the MOSFET of channel 2. In such circumstances, the voltage at the drain node of the MOSFET of channel 1 is lower than if no current were flowing through the LED string of channel 1.

In one embodiment, the reference voltage $V_{Ref1}$ can be selected to satisfy the following two conditions:
1. $V_{Ref1} < V_{C1}$, and
2. $V_{Ref1} > V_{Drain1}$ when current is flowing through the MOSFET of channel 1 (for instance, when $V_1$ is high)

Similarly, in one embodiment, the reference voltage $V_{Ref2}$ can be selected to satisfy the following two conditions:
1. $V_{Ref2} < V_{C2}$, and
2. $V_{Ref2} > V_{Drain2}$ when current is flowing through the MOSFET of channel 2 (for instance, when $V_2$ is high)

Referring to fault detection embodiments by channel 1, the comparator 160 compares $V_{Ref1}$ and $V_{Drain1}$, outputs channel_short_1 as high if $V_{Drain1} < V_{Ref1}$ (indicating the presence of short 165), and outputs channel_short_1 as low if $V_{Drain1} > V_{Ref1}$ (indicating that no short is detected between channels). Referring to fault detection embodiments by channel 2, the comparator 162 can output channel_short_2 similarly based on a comparison of $V_{Drain2}$ and $V_{Ref2}$. The detection of shorts between LED channels can occur before operation, for instance in the calibration mode described above or during PCB manufacture. Accordingly, the LED channel short detection circuit and the LED short detection circuit described above can be implemented with the same comparator. For example, the comparator 140 of FIG. 3 and the comparator 160 of FIG. 6 can be the same comparator. In such embodiments, the reference voltages $V_{Ref1}$ of FIG. 3 and $V_{Ref1}/V_{Ref2}$ of FIG. 6 can be different, and can change based on the mode of operation (calibration mode vs. normal mode). It should be noted that in calibration mode, every combination of LED channel pairs in an LED channel array can be individually tested as described herein to detect the presence of a short between any two LED channels.

Upon reading this disclosure, those of skill in the art will appreciate still additional alternative designs for controlling the dimming operation of an LED. Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the spirit and scope of the disclosure.

What is claimed is:

1. An LED fault detection circuit configured to detect one or more faults of an LED channel comprising one or more LEDs coupled to a drain node of a transistor and a resistor coupled to a source node of the transistor, the circuit comprising:
    a first fault detection circuit configured to detect a short fault across one or more of the LEDs, the first fault detection circuit coupled to the drain node of the transistor;
    a second fault detection circuit coupled to a source node of the transistor and configured to:
        when the LED fault detection circuit is operating in an operating mode, detect an open fault within the one or more LEDs; and
        when the LED fault detection circuit is operating in a calibration mode, detect a short fault across the resistor, wherein the LED fault detection circuit is configured to operate in the calibration mode before being configured to operate in the operating mode;
    a third fault detection circuit configured to detect a short fault across the drain node and the source node of the transistor, the third fault detection circuit coupled to the gate node of the transistor; and
    a fourth fault detection circuit comprising a comparator, a second transistor, and a current source coupled to a drain node of the second transistor, the fourth fault detected circuit coupled to the source node of the transistor and configured to detect an open fault across the resistor by, when the second transistor is configured to operate as a closed switch, comparing the voltage at the source node of the transistor to a reference voltage and outputting a fault signal indicating a presence or absence of the open fault across the resistor based on the comparison.

2. The LED fault detection circuit of claim 1, wherein the first fault detection circuit comprises a voltage divider coupled to the drain node of the transistor, the voltage divider comprising a first resistor and a second resistor coupled at a first node, the first fault detection circuit further comprising a comparator coupled to the first node.

3. The LED fault detection circuit of claim 2, wherein the comparator is configured to compare a voltage at the first node to a reference voltage and to output a fault signal indicating the presence or absence of a short fault across one or more of the LEDs based on the comparison.

4. The LED fault detection circuit of claim 1, wherein the second fault detection circuit comprises a comparator coupled to the source node of the transistor.

5. The LED fault detection circuit of claim 4, wherein the comparator is configured to, when the LED fault detection circuit is operating in an operating mode, compare a voltage at the source node of the transistor to a reference voltage and to output a fault signal indicating the presence or absence of an open fault within the one or more LEDs based on the comparison.

6. The LED fault detection circuit of claim 1, wherein the third fault detection circuit comprises a comparator coupled to the gate node of the transistor.

7. The LED fault detection circuit of claim 6, wherein the comparator is configured to compare a voltage at the gate node of the transistor to a reference voltage and to output a fault signal indicating the presence or absence of a short fault across the drain node and the source node of the transistor based on the comparison.

8. The LED fault detection circuit of claim 1, further comprising: a fifth fault detection circuit configured to detect an unused LED channel, the fifth fault detection coupled to the source node of the transistor.

9. The LED fault detection circuit of claim 8, the fifth fault detection circuit comprising:
    a second comparator coupled to the source node of the transistor, wherein the second comparator is configured to, when the transistor is configured to operate as an open switch and when the second transistor is configured to operate and when the second transistor is configured to operate as a closed switch, compare the voltage at the source node of the transistor to a second reference voltage greater than a reference voltage, and to output a second fault signal indicating that the LED channel is used or unused.

10. The LED fault detection circuit of claim 9, further comprising:
    a decoder coupled to the comparator and to the second comparator and configured to receive the fault signal and the second fault signal, and to output a status signal indicative of a state of the LED channel.

11. An LED fault detection integrated circuit configured to detect faults of an LED channel, the integrated circuit comprising:
    a first set of one or more fault detection circuits coupled to a source node of an LED channel transistor and configured to detect one or more LED channel faults when the integrated circuit is configured in a calibration mode; and
    a second set of one or more fault detection circuits configured to detect one or more LED channel faults when the integrated circuit is configured in an operating mode, at least one of the second set of fault detection circuits coupled to one of a drain node, a gate node, and a source node of the LED channel transistor, wherein the integrated circuit is configured to operate in the calibration mode before being configured to operate in the operating mode;
    wherein a first fault detection circuit of the first set of fault detection circuits and a second fault detection circuit of the second set of fault detection circuits comprises the same fault detection circuit, and wherein the same fault detection circuit is configured to detect a sense resistor short circuit fault when the integrated circuit is configured in the operating mode and to detect an LED open circuit fault when the integrated circuit is configured in the calibration mode;
    wherein the second set of one or more fault detection circuits includes a third fault detection circuit comprising:
        a voltage divider coupled to a drain node of the LED channel transistor, the voltage divider comprising a first resistor and a second resistor coupled at a first node; and
        a comparator coupled to the first node, the comparator configured to compare a voltage at the first node to a reference voltage and to output a fault signal indicating the presence or absence of a short fault across one or more LEDs in the LED channel.

12. The LED fault detection integrated circuit of claim 11, the first set of fault detection circuits comprising:
    a fourth fault detection circuit configured to detect an open fault at the source node of the LED channel transistor, the fourth fault detection circuit comprising:
        a second transistor, the source node of the second transistor coupled to the source node of the LED channel transistor;
        a current source coupled to a drain node of the second transistor; and
        a comparator coupled to a source node of the LED channel transistor, the comparator configured to compare a voltage at the source node of the LED channel transistor to a reference voltage and to output a fault signal indicating the presence or absence of an open fault at the source node of the LED channel transistor.

13. The LED fault detection integrated circuit of claim 12, the first set of fault detection circuits further comprising:
    a fifth fault detection circuit configured to detect an unused LED channel, the fifth fault detection circuit comprising:
        a second comparator coupled to the source node of the LED channel transistor, the second comparator configured to compare the voltage at the source node of the LED channel transistor to a second reference voltage and to output a second fault signal indicating that the LED channel is used or unused.

14. The LED fault detection integrated circuit of claim 13, further comprising:
    a decoder coupled to the comparator and to the second comparator and configured to receive the fault signal and the second fault signal, and to output a status signal indicative of a state of the LED channel.

15. The LED fault detection integrated circuit of claim 11, wherein the second set of fault detection circuits further comprises:
    a fourth fault detection circuit comprising:
        a second comparator coupled to the source node of the LED channel transistor, the second comparator configured to compare the voltage at the source node of the transistor to a second reference voltage and to output a second fault signal indicating the presence or absence of an open fault within the one or more LEDs based on the comparison.

16. The LED fault detection integrated circuit of claim 15, wherein the second set of fault detection circuits further comprises:
    a fifth fault detection circuit comprising:
        a third comparator coupled to the gate node of the LED channel transistor, the third comparator configured to compare a voltage at the gate node of the LED channel transistor to a reference voltage and to output a third fault signal indicating the presence or absence of a short fault across the drain node and the source node of the LED channel transistor based on the comparison.

* * * * *

UNITED STATES PATENT AND TRADEMARK OFFICE
CERTIFICATE OF CORRECTION

PATENT NO. : 9,999,110 B2  
APPLICATION NO. : 14/787270  
DATED : June 12, 2018  
INVENTOR(S) : Enzhu Liang, Yuwen Wang and Ming Gu Page 1 of 1

It is certified that error appears in the above-identified patent and that said Letters Patent is hereby corrected as shown below:

In the Claims

Column 8, Line 46, Claim 1, delete "detected circuit" and insert --detection circuit--.
Column 9, Line 19, Claim 8, delete "detection coupled" and insert --detection circuit--.
Column 9, Lines 26-27, Claim 9, after "and when the second transistor is configured to operate" delete "and when the second transistor is configured to operate".

Signed and Sealed this  
Thirteenth Day of November, 2018

Andrei Iancu  
*Director of the United States Patent and Trademark Office*